United States Patent [19]

Uchiyama

[11] 3,818,691

[45] June 25, 1974

[54] SOLAR CELL FOR TIMEPIECE

[75] Inventor: Hideaki Uchiyama, Suwa, Japan

[73] Assignee: Kabushiki Kaisha Surva Seikosha, Tokyo, Japan

[22] Filed: Dec. 26, 1972

[21] Appl. No.: 317,890

[30] Foreign Application Priority Data

Dec. 28, 1971 Japan .................................. 47-3342

[52] U.S. Cl. ...................... 58/23 C, 58/127, 260/37

[51] Int. Cl. ..... G04c 3/00, G04b 19/06, C08k 1/10

[58] Field of Search ............... 58/23 C, 23 BA, 127; 136/89; 260/37

[56] References Cited

UNITED STATES PATENTS

| | | | |
|---|---|---|---|
| 3,427,979 | 2/1969 | Kimura et al. | 58/23 |
| 3,509,712 | 5/1970 | Grohoski | 58/23 |

*Primary Examiner*—Edith Simmons Jackmon

*Attorney, Agent, or Firm*—Blum Moscovitz Friedman & Kaplan

[57] ABSTRACT

A solar cell utilized for operating a timepiece is improved in appearance by the application of a flatting paint to the light-sensitive surface thereof. The composition of the paint is such that the efficiency of the solar cell is not seriously decreased.

4 Claims, 1 Drawing Figure

PATENTED JUN 25 1974 3,818,691
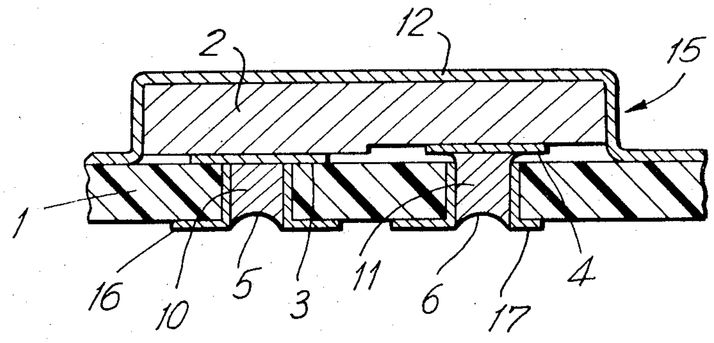

SOLAR CELL FOR TIMEPIECE

BACKGROUND OF THE INVENTION

In the use of a solar cell for driving a timepiece such as a wristwatch, the solar cells are produced under conditions such that the appearance thereof is relatively poor. Conventionally, distortion of the light-sensitive surface of the solar cell results during etching. Moreover, there is distortion of paint used on the peripheral portion of the light-sensitive surface which is caused by surface tension of the paint itself. Where the paint is transparent as has hitherto been the case, the appearance of the solar cells has been seriously degraded as a result of the application of paint. However, paint must be used in order to provide the damp-proofing necessary.

It is further conventional practice to evaporate a reflection-preventing layer, generally blue, onto the surface of the solar cell. Variations of tone of this color which is essentially an interference color again detract from the external appearance of a timepiece which has a plurality of solar cells on the dial, since it is quite difficult to control uniformity of the deposition by conventional evaporation technique.

SUMMARY OF THE INVENTION

A flattening paint which produces a semi-gloss coating is prepared by mixing pulverized silicic acid in a transparent paint of the epoxy type, silicone type or nitrocellulose type. The paint is applied over the light-sensitive surface of solar cells to form a protective layer against penetration by dampness without seriously affecting access of light to the solar cells themselves.

Accordingly, it is an object of the present invention to provide an improved appearance for solar cells used in driving a timepiece.

Another object of the present invention is to provide an improved appearance to solar cells used for driving a timepiece while protecting said solar cells from access by moisture.

A further object of the present invention is to provide an improved appearance from solar cells used for driving a timepiece by coating them with a flatting paint which results in a semi-gloss appearance.

An important object of the present invention is to provide a composition suitable for coating solar cells to improve their appearance over those conventionally used.

Yet another object of the present invention is to provide a timepiece driven by solar cells having improved appearance wherein the solar cells are protected from moisture without substantially decreasing the efficacy of said solar cells.

Still other objects and advantages of the invention will in part be obvious and will in part be apparant from the specification.

The invention accordingly comprises a composition of matter possessing the characteristics, properties, and the relation of components which will be exemplified in the composition hereinafter described and an article including said composition of matter, and the scope of the invention will be indicated in the claims.

BRIEF DESCRIPTION OF THE DRAWING

For a fuller understanding of the invention, reference is had to the following description taken in connection with the accompanying drawing in which:

The single FIGURE is a sectional view in elevation of a solar cell in accordance with the present invention.

DESCRIPTION OF THE PREFERRED EMBODIMENT

A solar cell in accordance with the present invention is shown in the single FIGURE. The solar cell itself, generally indicated by the reference numeral 15, rests on a dial 1 which is non-conductive. Dial 1 has apertures 5 and 6 therethrough in which are fixed conductive rivets 16 and 17. These rivets are so placed that they are in registry with electrodes 3 and 4 of solar cell 2. Solar cell 2 is affixed to dial plate 1 by means of solder 10 and 11 poured when molten into openings 5 and 6. Finally, solar cell 2 is covered with a coating having a composition in accordance with the present invention.

Compositions in accordance with the present invention can be formulated using any resinous material which is itself transparent and which is resistant to passage of moisture. Examples are epoxies, silicones, polyvinyl chloride, nitrocellulose and cellulose acetobutyrate. The materials are initially in a liquid state either because of the presence of solvent or because the materials have not as yet been subjected to a hardening reaction as is the case with epoxies and silicones.

In order to convert the transparent paint into a translucent paint, pulverized silicic acid is mixed therein to convert the paint into a semi-gloss material. The quantity of silicic acid is not critical and may range from 10 to as high as 60 or 70 percent of the total weight of the paint. The advantage of silicic acid is that it is itself translucent; however, the index of refraction of the silicic acid is different from that of the paint, as a result of which the paint appears to be opaque from the exterior and yet is quite translucent so that the effectiveness of the solar cell is but little decreased. Following is an example of a composition:

EXAMPLE

| | |
|---|---|
| Epoxy Resin | 60 parts |
| Pulverized Silicic Acid | 37 parts |
| Hardener | 3 parts |

Such a composition has a semi-gloss appearance, completely masking any variations in color tone of the solar cell beneath. Furthermore, the paint serves the purpose of preventing access by moisture to the solar cell while degrading the efficacy of the solar cell by no more than a few percent. Since any paint whether transparent or not reflects a certain quantity of light, the loss attributable to the presence of the pulverized silicic acid within the paint is negligible.

In the arrangement as shown in the single FIGURE, the rivets 16 and 17 can serve for interconnection between all the cells on a single dial, and the semi-gloss paint 12 can be applied uniformly over all of the solar cells as well as the spaces therebetween. Since the coating is opaque as viewed from the exterior, minor variations of thickness of the paint at corners whether exterior or interior will not be apparent, thereby further enhancing the appearance of a timepiece treated in accordance with the present invention. Further, the thickness of the coat can be adjusted to correspond to the resistance offered by the particular paint in the transfer of moisture therethrough. In general, the thickness of the coating is conveniently between about 5 microns and 60 microns. The effect on the efficacy of the solar cell will depend on the thickness of the coating and on the quantity of pulverized silicic acid therein. In general, the maximum loss in power output is less than 10 percent.

It will thus be seen that the objects set forth above, among those made apparent from the preceding description, are efficiently attained and, since certain changes may be made in the above composition of matter and in the article including said matter without departing from the spirit and scope of the invention, it is intended that all matter contained in the above description will be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A coated timepiece driven by solar cells comprising a dial, at least one solar cell mounted on said dial and a coating over said solar cell, said coating consisting of pulverized silicic acid and a transparent resinous medium resistant to passage of moisture therethrough, said silicic acid being dispersed in said medium in sufficient quantity to render said medium translucent and semi-gloss in appearance.

2. A coated timepiece as defined in claim 1 wherein said ratio of said silicic acid to said transparent medium lies between 10:90 and 70:30.

3. A coated timepiece as defined in claim 1 wherein the thickness of said coating lies between 5 and 60 microns.

4. A coated timepiece as defined in claim 1 wherein said transparent medium is selected from the group consisting of epoxy, silicone, nitrocellulose and cellulose acetobutyrate resins.

* * * * *